United States Patent
Kang et al.

(10) Patent No.: US 7,554,201 B2
(45) Date of Patent: Jun. 30, 2009

(54) TIN-BISMUTH (SN-BI) FAMILY ALLOY SOLDER AND SEMICONDUCTOR DEVICE USING THE SAME

(75) Inventors: Uu-Byung Kang, Hwaseong-si (KR);
Yong-Hwan Kwon, Suwon-si (KR);
Jong-Ho Lee, Asan-si (KR);
Chung-Sun Lee, Anyang-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 105 days.

(21) Appl. No.: 11/513,173

(22) Filed: Aug. 31, 2006

(65) Prior Publication Data

US 2007/0152331 A1 Jul. 5, 2007

(30) Foreign Application Priority Data

Dec. 29, 2005 (KR) .................. 10-2005-0133620

(51) Int. Cl.
*H01L 23/48* (2006.01)
(52) U.S. Cl. .............. 257/772; 257/E23.021; 257/E23.146; 257/E23.02; 257/737; 257/778; 257/738; 257/734; 257/784
(58) Field of Classification Search .......... 257/772, 257/737, 778, E23.021, 738, 780, E23.146, 257/E23.02, 734, 765, 784
See application file for complete search history.

(56) References Cited

U.S. PATENT DOCUMENTS

| | | | | |
|---|---|---|---|---|
| 5,796,591 | A * | 8/1998 | Dalal et al. ............... | 361/779 |
| 5,873,161 | A * | 2/1999 | Chen et al. ............... | 29/830 |
| 6,137,184 | A * | 10/2000 | Ikegami .................. | 257/785 |
| 6,555,052 | B2 * | 4/2003 | Soga et al. ............... | 420/560 |
| 6,884,313 | B2 * | 4/2005 | Liu et al. ................ | 156/292 |
| 2002/0053735 | A1 * | 5/2002 | Neuhaus et al. ........... | 257/728 |
| 2002/0129894 | A1 * | 9/2002 | Liu et al. ................ | 156/291 |
| 2003/0019568 | A1 * | 1/2003 | Liu et al. ................ | 156/245 |
| 2004/0232533 | A1 * | 11/2004 | Hatakeyama .............. | 257/678 |
| 2005/0029666 | A1 * | 2/2005 | Kurihara et al. ........... | 257/772 |
| 2005/0133572 | A1 * | 6/2005 | Brese et al. ............. | 228/180.22 |
| 2005/0275096 | A1 * | 12/2005 | Zeng et al. .............. | 257/737 |
| 2006/0030139 | A1 * | 2/2006 | Mis et al. ............... | 438/612 |
| 2006/0057404 | A9 * | 3/2006 | Itakura et al. ............ | 428/457 |

FOREIGN PATENT DOCUMENTS

| | | |
|---|---|---|
| JP | 11-031715 | 2/1999 |
| JP | 2001-274195 | 10/2001 |
| JP | 2004-349390 | 12/2004 |
| KR | 1020010098699 A | 11/2001 |
| KR | 2003-13527 | 2/2003 |
| KR | 1020030047514 A | 6/2003 |
| KR | 2005-76746 | 7/2005 |

* cited by examiner

*Primary Examiner*—Alexander O Williams
(74) *Attorney, Agent, or Firm*—Harness, Dickey & Pierce, P.L.C.

(57) ABSTRACT

Example embodiments of the present invention relate to an alloy solder and a semiconductor device using the alloy solder. Other example embodiments relate to an alloy solder capable of increasing reliability of a junction between a semiconductor chip and a substrate. According to still In still other example embodiments of the present invention, there may be a tin-bismuth (Sn—Bi) family alloy solder between a semiconductor chip and a substrate, and a semiconductor device using the alloy solder. The semiconductor device may include a semiconductor chip formed with a plurality of gold bumps, a substrate having metal wirings connected to the gold bumps, and a junction including a tin-bismuth family alloy solder interposed between and connecting the gold bump and the metal wiring.

12 Claims, 2 Drawing Sheets

_US 7,554,201 B2_

TIN-BISMUTH (SN-BI) FAMILY ALLOY SOLDER AND SEMICONDUCTOR DEVICE USING THE SAME

PRIORITY STATEMENT

This U.S. non-provisional application claims priority under 35 U.S.C. §119 from Korean Patent Application No. 2005-133620, filed on Dec. 29, 2005, in the Korean Intellectual Property Office (KIPO), the entire contents of which are herein incorporated by reference.

BACKGROUND

1. Field

Example embodiments of the present invention relate to an alloy solder and a semiconductor device using the alloy solder. Other example embodiments relate to an alloy solder capable of increasing reliability of a junction between a semiconductor chip and a substrate.

2. Description of the Related Art

In response to a recent trend towards miniaturization of electronic devices, various studies are being conducted in the semiconductor industry to mount more semiconductor chips on a smaller substrate by fabricating smaller and highly integrated semiconductor packages. Flip chip mounting technology has been used for mounting such semiconductor devices. Flip chip mounting technology is a technology in which a semiconductor chip may be directly mounted on a substrate by using conductive solder bumps. Flip chip mounting technology may have improved electrical properties due to a reduced connection distance between the substrate and semiconductor chip, compared with a conventional semiconductor chip mounting method (e.g., a wire bonding method and/or a tape automated bonding (TAB) technology using a tape wiring substrate).

According to the flip chip mounting technology disclosed in the conventional art, before a solder bump is formed on a semiconductor chip, an under bump metal (UBM) layer may be formed by plating a wafer unit on a bonding pad of the semiconductor chip, which may be costly. A semiconductor chip may also be mounted on a substrate by forming a gold (Au) stud bump and without forming the UBM layer on the bonding pad. In flip chip mounting technology using a gold (Au) stud bump, the gold (Au) stud bump may be formed on a bonding pad of a semiconductor chip. The gold (Au) stud bump of the semiconductor chip may be attached to a substrate using an alloy solder. Connection resistance may be reduced, because the signal transfer path may be shorter. Production cost may also be reduced, because the gold (Au) stud bump may be formed using a wire bonding method that is used as a chip connection method for semiconductor devices. Alloy solders have traditionally been tin-lead (Sn—Pb) solders. Lead (Pb)-free solders (e.g., solders containing tin, Sn-3.5Ag, Sn-2.5Ag-1Cu and/or the like) have been used recently due to environmental reasons.

Alloy solders may electrically connect a semiconductor chip and substrate through a reflow process. If a paste type alloy solder is interposed between a gold (Au) stud bump in the semiconductor chip and a substrate pad on the substrate, and the temperature is above the melting point of the alloy solder, the alloy solder may melt and react with the gold (Au) stud bump and substrate pad (e.g., copper (Cu), gold/nickel (Au/Ni), and/or any other suitable element or compound). The semiconductor chip may then attach to the substrate. FIG. 1 illustrates a junction formed after completing a conventional attachment process.

FIG. 1 is a photo of a junction observed by an optical microscope, in which a gold (Au) stud bump may be flip chip bonded to a substrate formed with a conventional tin-silver-copper (Sn—Ag—Cu) alloy solder. The photo is taken by a scanning electron microscope (SEM) to identify a microstructure of the junction.

Referring to FIG. 1, a junction 30 may be formed using a gold (Au) stud bump 32 and a tin-silver-copper (Sn—Ag—Cu) alloy solder. An intermetallic compound layer of AuSn/AuSn$_2$ 34 may be thinly formed on a surface in contact with the gold (Au) stud bump 32. An intermetallic compound layer of AuSn$_4$ 36, constituting most of the junction 30, may be formed under the intermetallic compound layer of AuSn/AuSn$_2$ 34, and a small amount of tin (Sn) 37 may remain inside the intermetallic compound layer of AuSn$_4$ 36. A thin intermetallic compound layer of nickel-tin (Ni—Sn) 38 may be formed through a reaction with nickel (Ni) on the surface of a substrate pad 22. The structure of the junction 30 illustrates a similar result with a two element alloy solder (e.g., a tin-silver (Sn—Ag) solder and/or any other suitable solder), with a pure-Sn solder and/or any other suitable solder, and with a three (3) element alloy solder of tin-silver-copper (Sn—Ag—Cu). The intermetallic compound layer of AuSn$_4$ 36 may be formed in a relatively large amount after a reflow process, because the diffusion rate of gold (Au) into a solder (e.g., a pure-Sn, tin-silver (Sn—Ag), tin-silver-copper (Sn—Ag—Cu) solder and/or any other suitable solder) may be relatively fast in a liquid state.

If a relatively large amount of the intermetallic compound layer AuSn$_4$ is formed in the junction, the junction may be deformed easily by external forces, because the junction is brittle mechanically. If a temperature change test is conducted, cracks may easily occur at the junction to which stresses are applied due to the difference between the thermal expansion ratios of the semiconductor chip and substrate. The reliability of the junction may thereby decrease.

SUMMARY

Example embodiments of the present invention relate to an alloy solder and a semiconductor device using the alloy solder. Other example embodiments relate to an alloy solder capable of increasing reliability of a junction between a semiconductor chip and a substrate.

Example embodiments of the present invention may be a tin-bismuth (Sn—Bi) family alloy solder capable of securing reliability of a junction. The formation of an intermetallic compound of AuSn$_4$, which is brittle mechanically, may be suppressed at the junction between a gold (Au) bump and a substrate pad. Example embodiments of the present invention may also provide a semiconductor device using the tin-bismuth (Sn—Bi) family alloy solder.

Example embodiments of the present invention may provide a tin-bismuth (Sn—Bi) family alloy solder interposed between and connecting a gold (Au) bump of a semiconductor chip and a metal wiring of a substrate. The alloy solder may include tin (Sn) and bismuth (Bi), wherein the amount of bismuth (Bi) may be about 20 wt %-about 55 wt % of the alloy solder.

The tin-bismuth (Sn—Bi) family alloy solder may further include an impurity below about 3 wt % of the alloy solder, wherein the impurity may be at least one selected from the group including silver (Ag), copper (Cu) and zinc (Zn).

Example embodiments of the present invention may provide a tin-bismuth (Sn—Bi) family alloy solder interposed between and connecting a gold (Au) stud bump of a semiconductor chip and a metal wiring of a substrate. The alloy solder may include about 20 wt %-about 55 wt % of bismuth (Bi), tin (Sn) and an impurity below about 3 wt %, wherein the impurity may be at least one selected from the group including silver (Ag), copper (Cu) and zinc (Zn).

Example embodiments of the present invention may further provide a semiconductor device including a semiconductor chip formed with a plurality of gold (Au) bumps, a substrate having metal wiring connected with the gold (Au) bumps and a junction including an alloy solder interposed between and connecting the gold (Au) bumps and the metal wiring. The alloy solder of the junction may include tin (Sn) and bismuth (Bi), wherein the amount of bismuth (Bi) may be about 20 wt %-about 55 wt % of the alloy solder. The metal wiring may include copper (Cu) as a main component. The junction may include a first alloy layer made mostly of $AuSn_2$. The first alloy layer may be formed on the surface of the gold (Au) bump. The junction may also include a second alloy layer made mostly of $Cu_6Sn_5$ or $Cu_3Sn$. The second alloy layer may be formed on the surface of the metal wiring. The junction may further include an alloy solder layer formed between the first and second alloy layer.

In example embodiments of the present invention, the gold (Au) bump may be a gold (Au) stud bump, and the total volume of the alloy solder layer and the second alloy layer of the junction may be above about 50 at % (atomic percent) of the volume of the junction. The semiconductor device may further include an encapsulating resin layer between the semiconductor chip and the substrate. The substrate may be a printed circuit board, a tape wiring substrate, a ceramic substrate and/or a silicon substrate.

BRIEF DESCRIPTION OF THE DRAWINGS

Example embodiments of the present invention will be more clearly understood from the following detailed description taken in conjunction with the accompanying drawings.

FIG. 1 is a photo of a conventional junction observed by an optical microscope, in which a gold (Au) stud bump may be bonded to a substrate formed with a tin-silver-copper (Sn—Ag—Cu) alloy solder.

FIG. 2 is a diagram illustrating a semiconductor device according to example embodiments of the present invention.

FIG. 3 is a diagram illustrating a portion 'A' of FIG. 2 according to example embodiments of the present invention.

DETAILED DESCRIPTION OF THE EXAMPLE EMBODIMENTS

Figure 1:
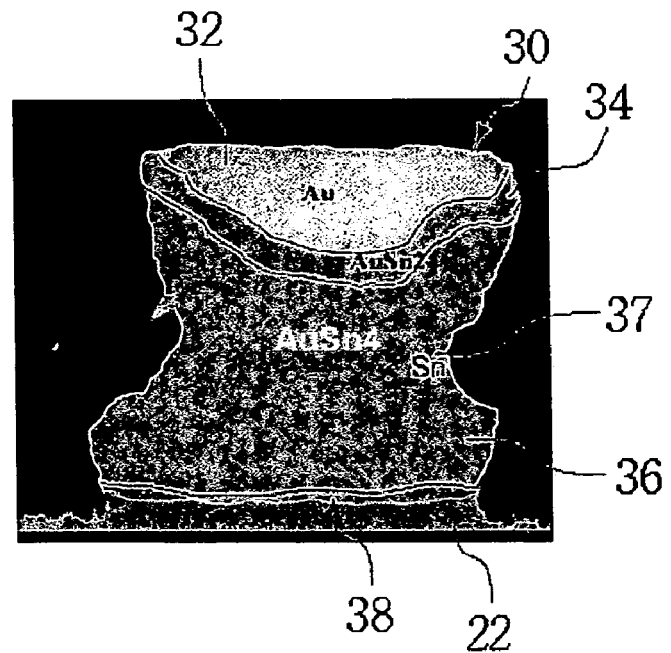
FIGS. 1-3 represent non-limiting, example embodiments of the present invention as described herein.

Various example embodiments of the present invention will now be described more fully with reference to the accompanying drawings, in which some example embodiments of the present invention are shown. Example embodiments of the present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

In the description, well-known structures and processes have not been described or illustrated to avoid obscuring example embodiments of the present invention. In the drawings, some elements are exaggerated or only outlined in brief, and thus may not be drawn to scale for simplicity and clarity of illustration. The same reference symbols are given to the same or corresponding elements in the drawings.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of the example embodiments of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to an alloy solder and a semiconductor device using the alloy solder. Other example embodiments relate to an alloy solder capable of increasing reliability of a junction between a semiconductor chip and a substrate.

Figure 2:
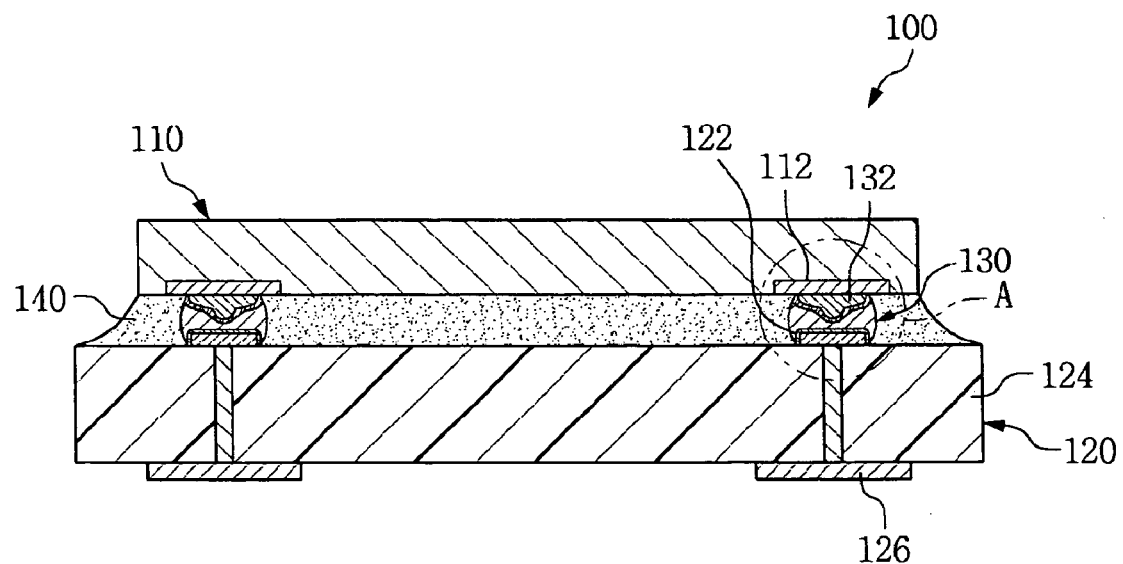

FIG. 2 is a diagram illustrating a semiconductor device according to example embodiments of the present invention.

Referring to FIG. 2, a semiconductor device 100 may include a semiconductor chip 110 formed with a gold (Au) stud bump 132, a substrate 120 formed with metal wiring (not shown), a junction 130 interposed between the semiconductor chip 110 and the substrate 120, and an encapsulating resin layer 140 between the substrate 120 and semiconductor chip 110 according to example embodiments of the present invention.

A pattern (not shown) including circuits and bonding pads 112 may be formed on a single crystal silicon active surface of the semiconductor chip 110. The pattern may be made of aluminum (Al) or an aluminum alloy (e.g., Al—Cu, Al—Si, Al—Cu—Si and/or any other suitable aluminum alloy). The active surface of the semiconductor chip 110, excluding bonding pads 112, may be covered by a passivation layer and an insulating layer (not shown) (e.g., a polyimide film and/or any other suitable film) for protection. A gold (Au) stud bump 132 may be formed on the bonding pad 112 of the semiconductor chip 110. The gold (Au) stud bump 132 may be thermo-compression bonded on the surface of the bonding pad 112 of semiconductor chip 110 and directly attached to the bonding pad 112. The gold (Au) stud bump 132 may be made of pure gold (Au) or a gold (Au) alloy containing impurities suitable for adjusting hardness. Although a semiconductor chip 110 may be formed with gold (Au) stud bumps 132, example embodiments of the present invention may be applied to a semiconductor chip 110 formed with a gold (Au) bump 132 on a bonding pad 112 of the semiconductor chip 110 by electroplating and electroless plating using lithography.

Metal wirings 122 and 126 may be formed on both surfaces of an insulating member 124 of the substrate 120. The metal wirings 122 and 126 may include a substrate pad 122 that may be attached to the semiconductor chip 110. The metal wirings 122 and 126 may further include a ball pad 126 that may be attached to an external connection terminal (not shown). Metal wirings 122 and 126 may be formed with copper (Cu) or a copper alloy and may have improved conductivity. The insulating member 124 may be formed with various resins (e.g., polyimide family resins, epoxy family resins and/or any other suitable resins). The substrate 120 may be a printed circuit board, a tape wiring substrate, a ceramic substrate, a silicon substrate and/or any other suitable substrate according to example embodiments of the present invention. The junction 130 may mechanically connect the semiconductor chip 110 and the substrate 120. The junction 130 may also act as a path for electrical signals.

Figure 3:
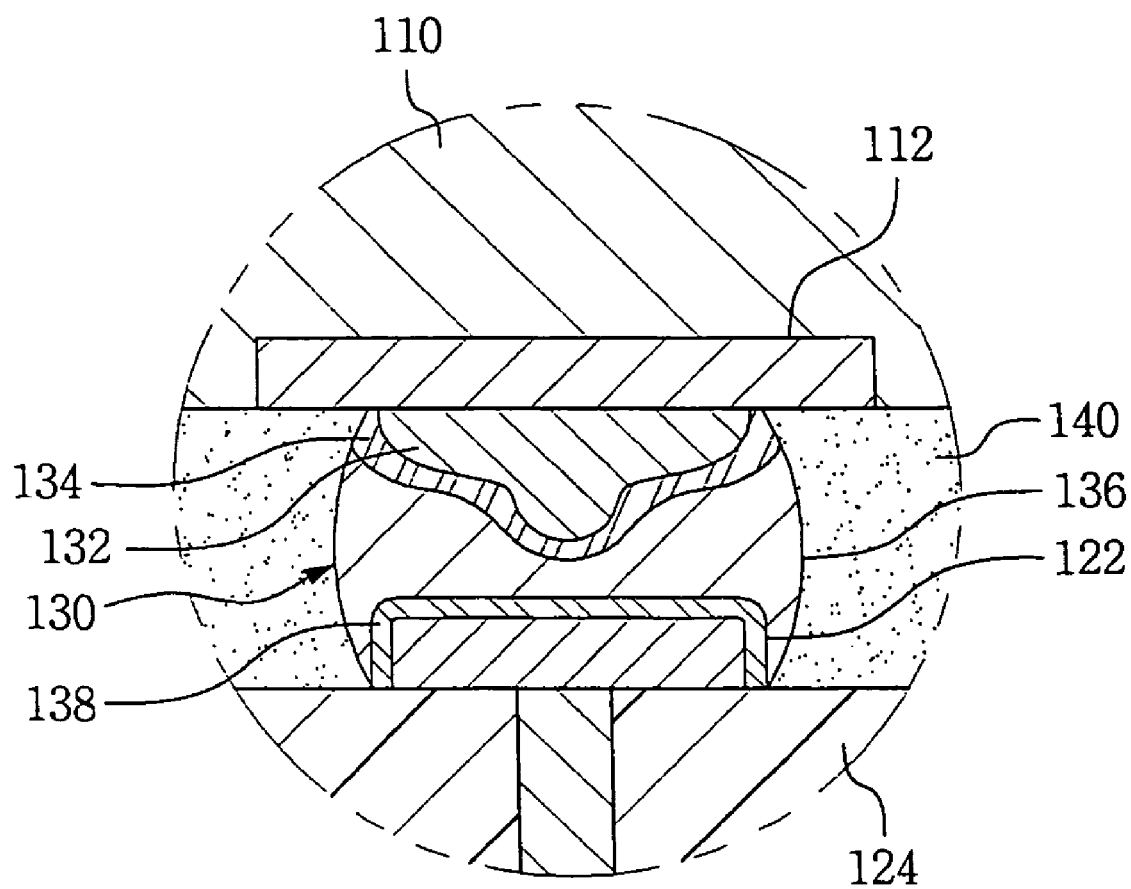

FIG. 3 is a diagram illustrating a portion 'A' of FIG. 2 according to example embodiments of the present invention.

Referring to FIG. 3, the junction 130 may include a first alloy layer 134, a second alloy layer 138 and an alloy solder layer 136. The first alloy layer 134 may be a thin layer formed by the reaction between the tin (Sn) in the alloy solder layer 136 and the gold (Au) in the gold (Au) stud bump 132. The first alloy layer 134 may be an intermetallic compound of gold-tin (Au—Sn), containing mostly $AuSn_2$, which is formed on the surface of the gold (Au) stud bump 132. The second alloy layer 138 may be a thin layer formed by the reaction between the tin (Sn) in the alloy solder layer 136 and copper (Cu) of the substrate pad 122. The second alloy layer 138 may be an intermetallic compound, containing mostly $Cu_6Sn_5$ or $Cu_3Sn$, which is formed on the surface of the substrate pad 122. The alloy solder layer 136 may be interposed between the first alloy layer 134 and second alloy layer 138 and may electrically connect the semiconductor chip 110 and substrate 120. The alloy solder layer 136 may contain mostly tin-bismuth (Sn—Bi) and may contain at least one impurity selected from the group including silver (Ag), copper (Cu) and zinc (Zn).

As the amount of a gold-tin (Au—Sn) family intermetallic compound on the junction 130 is reduced, reliability of the junction 130 may increase. The total volume of the alloy solder layer 136 and second alloy layer 138 may be greater than the volume of the first alloy layer 134. The total volume of alloy solder layer 136 and second alloy layer 138 may be greater than about 50% (atomic percent) of the total volume of the junction 130. An encapsulating resin layer 140 may be formed in the space between the semiconductor chip 110 and substrate 120. The encapsulating resin layer 140 may increase adhesion between the semiconductor chip 110 and substrate 120 and may more stably support the semiconductor chip 110. The encapsulating resin layer 140, injected in a liquid state, may fill the space between the semiconductor chip 110 and substrate 120. The encapsulating resin layer 140 may form a support layer after hardening, thereby increasing support of the semiconductor chip 110 and reducing the risk of damage to the semiconductor device 100 due to external forces. The junction 130 of the semiconductor device 100 may be formed by interposing an alloy solder of a paste type and/or pre-solder type between the semiconductor chip 110 and a metal wiring of the substrate 120 according to example embodiments of the present invention. A reflow process may then be performed on the junction 130.

A tin-bismuth (Sn—Bi) family alloy solder may be a two element alloy solder or a three element alloy solder with an added impurity. A tin-bismuth (Sn—Bi) family alloy solder may have a eutectic structure, and may not form any intermetallic compound of its constituents. An intermetallic compound may be formed by the reaction between a gold (Au) stud bump 132 and the tin-bismuth (Sn—Bi) family alloy solder. When a gold (Au) stud bump 132 and substrate pad 122 are connected using the tin-bismuth (Sn—Bi) family alloy solder, an intermetallic compound of $AuSn_4$ (e.g., Sn, Sn-3.5Ag and Sn-2.5Ag-1Cu) and a gold (Au) stud bump may not be formed.

It is unclear why the intermetallic compound of $AuSn_4$ may not be formed in the reaction between gold (Au) and a tin-bismuth (Sn—Bi) family alloy solder. When solders (e.g., tin (Sn), tin-silver (Sn—Ag), and/or tin-silver-copper (Sn—Ag—Cu) solders) are in a liquid state, the limited amount of gold (Au) that may be melted and diffused into the solder may be about 5 wt %~about 10 wt % (weight percent). In the case of a tin-bismuth (Sn—Bi) family alloy solder, the limited amount of gold (Au) that may be melted and diffused into the liquid alloy solder may be below about 1 wt %. In the case of a 43% Sn-57% Bi alloy, the limited amount may be about 0.8 wt %. When compared with other alloy solders, the amount of gold that may be melted and diffused into a tin-bismuth (Sn—Bi) family alloy solder may be smaller. The diffusion rate of gold (Au) and growth speed of an intermetallic compound in a tin-bismuth (Sn—Bi) family alloy solder may be lower.

As the percentage of bismuth (Bi) contained in a tin-bismuth (Sn—Bi) family alloy solder is increased, the amount of gold (Au) that may be melted and diffused into the liquid alloy solder is decreased and the growth of an intermetallic compound may be inhibited. Reliability of the junction 130 may decrease if bismuth (Bi) is contained, because bismuth (Bi) is brittle mechanically when compared with tin (Sn). If bismuth (Bi) is contained in a smaller amount, the probability of $AuSn_4$ growth may increase. The amount of bismuth (Bi) content should be about 20~about 55 wt % of the tin-bismuth (Sn—Bi) family alloy solder according to example embodiments of the present invention. The tin-bismuth (Sn—Bi) family alloy solder may be formed with a three element alloy solder (e.g., a tin-bismuth-copper (Sn—Bi—Cu), tin-bismuth-zinc (Sn—Bi—Zn) or tin-bismuth-silver (Sn—Bi—Ag) solder) that includes impurities (e.g., copper (Cu), zinc (Zn) and/or silver (Ag)) to supplement the solder mechanically against external forces. If the impurities are contained, a new reaction may occur due to the impurities. Also, the reliability may be decreased and the impurities below about 3 wt % may be included.

If the junction 130 of the semiconductor device 100 is formed using an tin-bismuth (Sn—Bi) family alloy solder as shown in FIG. 3, its thickness (or volume) may be smaller compared with a gold-tin (Au—Sn) family intermetallic compound (e.g., $AuSn_4$ and/or any other suitable compound) formed when another alloy solder may be used. This may be the case even though a gold-tin (Au—Sn) family intermetallic compound (e.g., $AuSn$, $AuSn_2$, $AuSn_4$ and/or any other suitable compound) exists at the interface of the gold (Au) stud bump 132 and the tin-bismuth (Sn—Bi) family alloy solder layer 136.

If the semiconductor device 100 is fabricated using the gold (Au) stud bump 132 and a tin-bismuth (Sn—Bi) family alloy solder, the tin-bismuth (Sn—Bi) family alloy solder may not react with gold (Au). A majority of the tin-bismuth (Sn—Bi) family alloy solder may remain in the junction 130 as the tin-bismuth (Sn—Bi) family alloy solder layer 136. Solders (e.g., tin (Sn), tin-silver (Sn—Ag), and/or tin-silver-copper (Sn—Ag—Cu) solders) may react with gold (Au) and may be transformed into a larger amount of $AuSn_4$ intermetallic compound. The reliability of the junction between the semiconductor chip 110 and substrate 120 may then be increased.

Example embodiments of the present invention may be modified into various other shapes, and the scope of example embodiments of the present invention should not be limited by example embodiments described above. For example, although example embodiments of the present invention describe a junction in which a semiconductor chip and substrate may be contacted, example embodiments of the present invention may not be limited to the above junction, but may be applied to all other junctions connected using gold (Au) bumps (e.g., if two semiconductor chips are stacked and connected through gold (Au) bumps).

In a semiconductor device according to example embodiments of the present invention, a tin-bismuth (Sn—Bi) family alloy solder, containing about 20 wt %-about 55 wt % bismuth (Bi), may be interposed between and connect a gold (Au) bump of the semiconductor chip and a metal wiring of the substrate.

Accordingly, the formation of a relatively large amount of $AuSn_4$ intermetallic compound, which may be mechanically brittle, is inhibited and reliability of the junction may be increased.

The foregoing is illustrative of example embodiments of the present invention and is not to be construed as limiting thereof. While example embodiments of the present invention have been particularly shown and described with reference to the example embodiments shown in the drawings, it will be understood by those of ordinary skill in the art that various changes in form and details may be made therein without departing from the spirit and scope of example embodiments of the present invention as defined by the following claims.

What is claimed is:

1. A tin-bismuth (Sn—Bi) family alloy solder interposed between and connecting a gold (Au) bump of a semiconductor chip and metal wiring of a substrate, the alloy solder comprising tin (Sn) and bismuth (Bi), wherein the amount of bismuth (Bi) is about 20 wt %-about 55 wt % of the alloy solder wherein the gold (Au) bump and the alloy solder form an alloy layer containing $AuSn_2$ as a main component.

2. The tin-bismuth (Sn—Bi) family alloy solder of claim 1, further comprising:
an impurity below about 3 wt %.

3. The tin-bismuth (Sn—Bi) family alloy solder of claim 2, wherein the impurity is at least one selected from the group including silver (Ag), copper (Cu) and zinc (Zn).

4. The tin-bismuth (Sn—Bi) family alloy solder of claim 1, wherein the gold (Au) bump of a semiconductor chip is a gold (Au) stud bump.

5. A tin-bismuth (Sn—Bi) family alloy solder interposed between and connecting a gold (Au) bump of a semiconductor chip and metal wiring of a substrate, the alloy solder comprising about 20 -about 55 wt % of bismuth (Bi), tin (Sn), and below about 3 wt % of impurity, wherein the impurity is at least one selected from the group including silver (Ag), copper (Cu) and zinc (Zn).

6. A semiconductor device, comprising:
a semiconductor chip formed with a plurality of gold (Au) bumps;
a substrate having a metal wiring connected with the gold (Au) bumps; and
a junction including an alloy solder, according to claim 1, interposed between and connecting the gold (Au) bumps and the metal wiring.

7. The semiconductor device of claim 6, wherein the metal wiring includes copper (Cu) as a main component.

8. The semiconductor device of claim 6, wherein the junction includes:
a first alloy layer formed on the surface of the gold (Au) bump and containing the $AuSn_2$;
a second alloy layer formed on the surface of the metal wiring and containing $Cu_6Sn_5$ or $Cu_3Sn$ as a main component; and
an alloy solder layer formed between the first and second alloy layer.

9. The semiconductor device of claim 6, wherein the gold (Au) bump is a gold (Au) stud bump.

10. The semiconductor device of claim 8, wherein the total volume of the alloy solder layer and the second alloy layer of the junction is above about 50 at % (atomic percent) of the volume of the junction.

11. The semiconductor device of claim 6, further comprising:
an encapsulating resin layer filled between the semiconductor chip and the substrate.

12. The semiconductor device of claim 6, wherein the substrate is a printed circuit board, a tape wiring substrate, a ceramic substrate or a silicon substrate.

* * * * *